United States Patent
Warren et al.

(10) Patent No.: US 6,690,313 B1
(45) Date of Patent: Feb. 10, 2004

(54) DIGITAL-TO-ANALOG UPCONVERTER

(75) Inventors: Henry P. Warren, Los Angeles, CA (US); David L. Crampton, Rossmoor, PA (US); Anthony L. McKay, Long Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/273,207

(22) Filed: Oct. 17, 2002

(51) Int. Cl.[7] .................................................. H03M 1/66
(52) U.S. Cl. .......................... 341/144; 341/141; 375/216
(58) Field of Search ................................. 341/144, 141, 341/118; 375/216

(56) References Cited

U.S. PATENT DOCUMENTS

| 5,059,977 | A | | 10/1991 | Herman et al. | |
|---|---|---|---|---|---|
| 5,757,794 | A | * | 5/1998 | Young | ........................ 370/362 |
| 6,218,974 | B1 | * | 4/2001 | Dedic | ......................... 341/144 |
| 6,310,908 | B1 | | 10/2001 | Reed et al. | |

* cited by examiner

Primary Examiner—Jean Bruner Jeanglaude
(74) Attorney, Agent, or Firm—Terje Gudmestad

(57) ABSTRACT

The digital signal is provided to the digital-to-analog upconverter (40) such as through digital signal processing circuitry (70). A sample rate signal and a divided sample rate signal are provided by divider chain (96) using the clock input (44). The divided sample rate signal is used to drive the decode circuit (88). The digital outputs of the decoder circuit (88) is combined with the sample rate signal in a mixer (52) which in turn generates a digitally upconverted signal which drives a plurality of switches combined together to form the analog output (46).

23 Claims, 8 Drawing Sheets

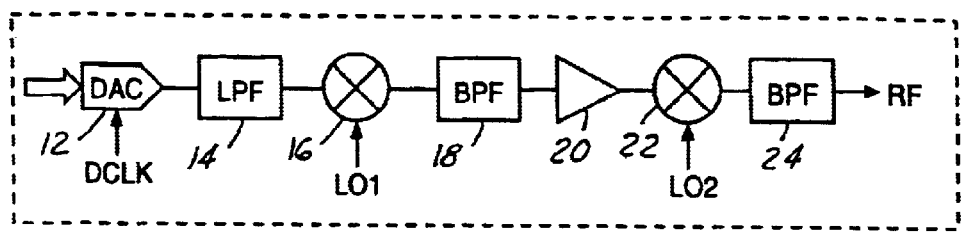
FIG. 1 PRIOR ART
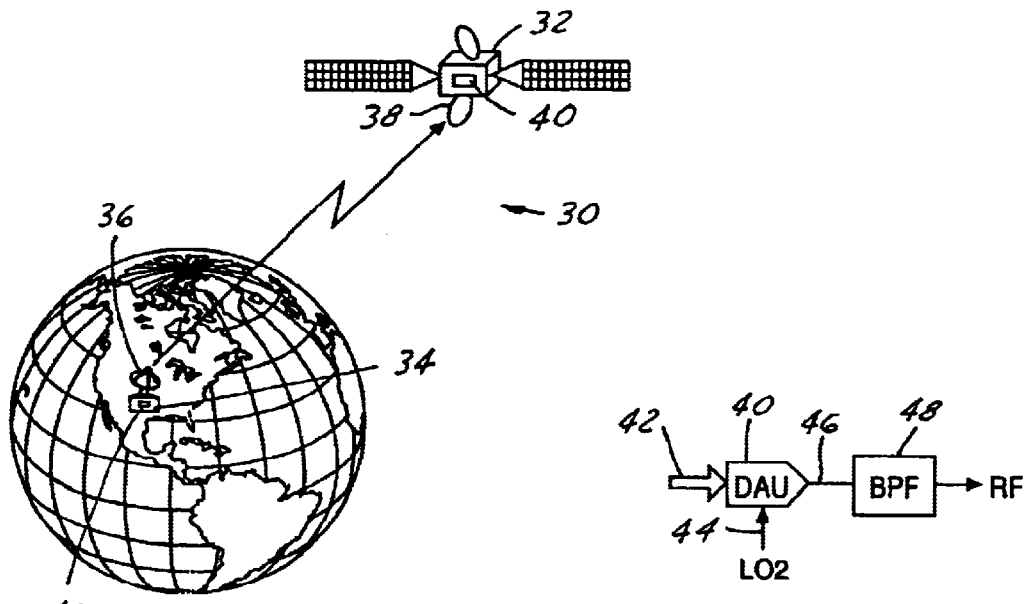
FIG. 2
FIG. 3
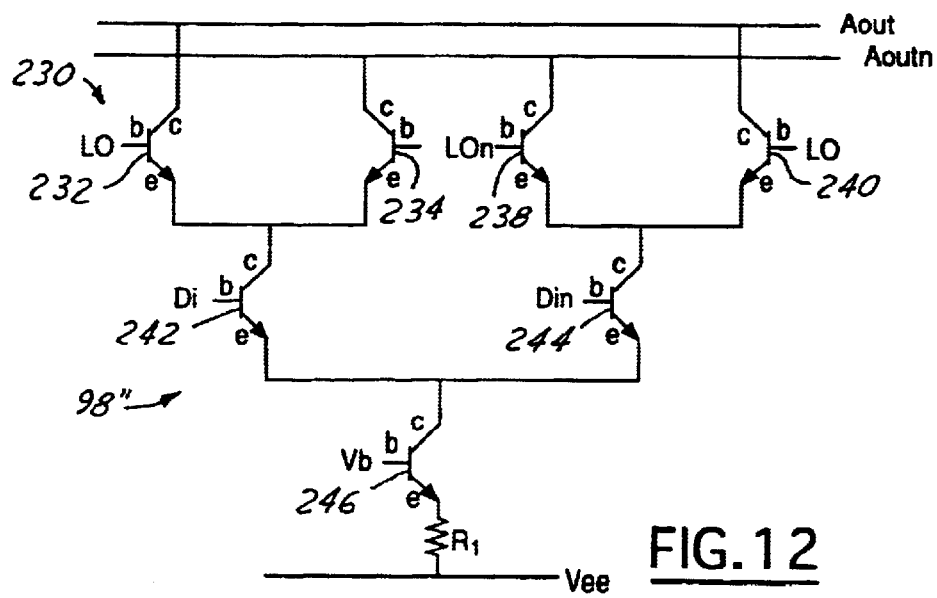
FIG. 12

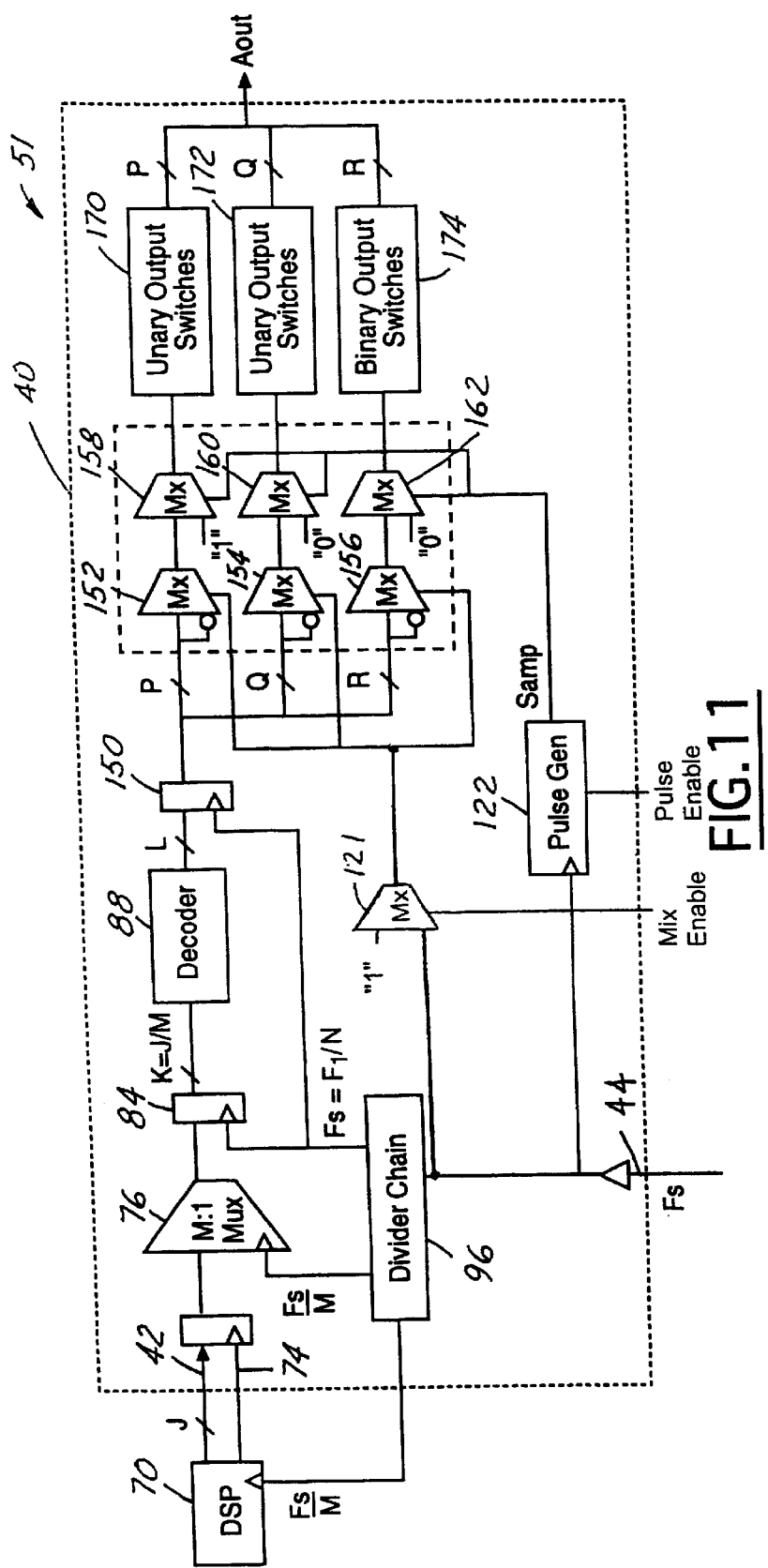

DIGITAL-TO-ANALOG UPCONVERTER

TECHNICAL FIELD

The present invention relates generally to digital-to-analog converters and more particularly to a digital-to-analog converter performing an upconverter function.

BACKGROUND ART

Various types of wireless telecommunication systems use digital-to-analog converters (DAC). Such systems include satellite communication systems which use DACs both on-board and in terrestrial gateway stations. Other types of systems include cellular communication systems and the like.

DACs translate digital words into analog voltages or currents. In a conventional current switching DAC a digital word controls a bank of switched current sources. The output current, or voltage, is derived from the number of current sources switched to the output port. The switches control analog weighted current sources. Typically there is an assortment of binary and unary, or equally weighted current sources. Other current source weighting schemes are equally valid however. In the double upconverting wireless electronic communication system 10 shown in FIG. 1, a digital-to-analog converter 12 is followed by a low-pass filter 14 and an intermediate frequency upconverting mixer 16. A bandpass filter 1 8, an amplifier 20, a second upconverting mixer 22, and an output bandpass filter 24 is also included in the system 10. An RF upconverted signal is thus generated. In satellite payloads and perhaps even more critically in many hand-held wireless electronic communication devices, reduction of weight, size, and the number of components is important. Both mixers 16 and 22 have different clock inputs, also known as local oscillator (LO) inputs, denoted as LO1 and LO2. The mixer, filter, LO and amp circuitry consume power, size and add weight to the communication system.

There are three primary methods of upconverting a baseband DAC signal. The first method as depicted in FIG. 1 is to low pass filter a baseband DAC output, and then upconvert with one or more stages of analog mixer and bandpass filter. This first method is realized with three or more separate components, a baseband DAC, an analog filter(s) and analog mixer(s). While the analog mixer/analog filter approach is a reliable method, it generally is larger, more complex, costly, and requires more assembly than other approaches The second method is to digitally mix the baseband signal prior to sending the digital data to the DAC. In such a system it is typically required that the DAC clock in the digital data at a rate greater than or equal to the mixer LO upconversion frequency to avoid frequency aliasing from another nyquist band. A substantial drawback of this approach is that the digital signal processing, for example the DAC decode logic, that follows the mixing function uses clock speeds far in excess of those necessary to support the data bandwidth, placing a heavy burden on the DAC digital receiving and decoding circuitry, especially for high mixer LO frequencies. The upconverting DAC described herein is far more efficient in its distribution of clock frequencies, insofar as most, if not all, digital circuitry of the DAC can be clocked at rates minimally sufficient to support the data bandwidth.

The third method is to pulse sample the DAC output with either a return-to-zero or return-to-mid level signal. One key advantage of the pulse sample approach over the second approach detailed above of digital mixing prior to DAC decoding is that the DAC input data rates and decoder circuit is clocked at the lower data bandwidth rates, not the upconverted rates. A drawback of the third method is that it does not peak the signal level in the desired upconverted nyquist band signal rendering it less power efficient. Further, the output signal amplitude is very sensitive to fluctuations in the sampling pulse width. Additional circuitry may be required to stabilize, increase the amount of filtering, and/or amplify the output signal in the desired upconverted frequency band.

It would therefore be desirable to provide a circuit and method for accurately converting a digital signal to an analog signal that reduces power consumption, size, weight and reduces the number of components therein.

SUMMARY OF THE INVENTION

The Digital-to-Analog Upconverter (DAU) described herein extends the function of a conventional DAC by incorporating a digital mixer into the output current switching array.

In one aspect of the invention, the digital signal is provided to the digital-to-analog upconverter such as through digital signal processing circuitry. A sample rate signal and a divided sample rate signal are provided by divider chain using the clock input. The divided sample rate signal is used to drive the decode circuit, which in many cases is a binary-to-thermometer decoder. The digital outputs of the decoder are combined with the sample rate signal in a digital mixer to create a digital control word. The digital control word switches a plurality of analog output switches to analog output port.

In a further aspect of the invention, a method for operating a digital-to-analog upconverter comprises generating a sample rate signal, dividing the sample rate signal by an integer to form a divided sample rate signal, converting a digital signal to digital decoded signal in response to the divided sample rate signal, digitally mixing the sample rate signal and the decoded signal, and generating an analog output in response to the digital mixer output signal.

Several advantages are achieved by (1) embedding the digital mixer into the current switches, and (2) mixing at an integer multiple of the DAC sample rate. First, as shown in FIG. 1, the low pass filter that is typically situated between the DAC and the first upconverter mixer is eliminated. In addition, FIG. 1 indicates that a second upconverting stage, bandpass filter, amp, and mixer may also be eliminated depending on the user's application. Secondly, as FIG. 4 indicates, the upconverted nyquist band looks much like the first nyquist band of a baseband DAC in terms of preserving harmonic frequency spacing and relative power. A third advantage, also seen in FIG. 4D, is that the output power is peaked for maximum power efficiency in the upconverted nyquist upper and/or lower sidebands. A fourth advantage is that the DAU data rates and/or clock frequencies are typically lower or as low as other upconverting DAC approaches which translates generally speaking into lower power dissipation, lower I/O data rates, and greater ease of implementation. Finally, perhaps the greatest feature of the DAU is its simplicity. It vastly extends the usefulness and range of system applications of a generic electronic component, digital-to-analog converters, with a quite simple circuit modification.

BRIEF DESCRIPTION OF THE DRAWINGS

FIG. 1 is a schematic view of an upconverter according to the prior art.

FIG. 2 is a satellite communication system utilizing the digital-to-analog upconverter according to the present invention.

FIG. 3 is a schematic view of a digital-to-analog upconverter (DAU) according to the present invention.

FIG. 11 is a plot of an alternative digital-to-analog upconverter using multi-mode operation according to the present invention.

FIG. 12 is a schematic of an RF/IF digital-to-analog embedded mixer switch circuit.

BEST MODES FOR CARRYING OUT THE INVENTION

Figure 4A:
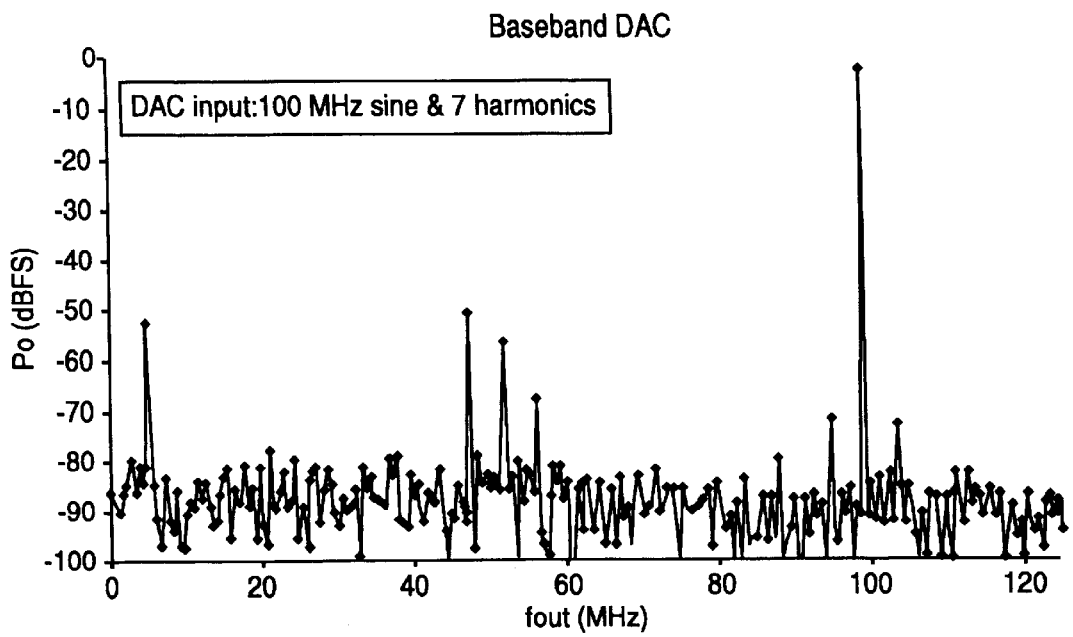
FIGS. 4A–4D illustrate signal energies at various output frequencies for a baseband digital-to-analog converter and the present invention.

In the following figures the same reference numerals will be used to illustrate the same components.

The present invention is described with respect to a satellite communication system. However, various types of electronic components that provide digital-to-analog conversion and a frequency upconversion may also benefit from the present invention. For example, wireless telephony systems may benefit by implementing the present invention.

Referring now to FIG. 2, a communication system 30 is a satellite communication system that has a satellite 32 that communicates with a gateway station or users 34. Communication signals 36 are transmitted between the gateway station or users 34 and satellite 32 through respective antennas 36 and 38. Either or both of satellite 32 and gateway station or users 34 may include a digital-to-analog upconverter 40 formed according to the present invention.

Referring now to FIG. 3, digital-to-analog upconverter 40 is shown as would be typically formed in operation. Digital-to-analog upconverter 40 has a digital input 42 and a clock input 44. A digital-to-analog upconverter 40 has an analog output 46 that is coupled to a bandpass filter 48. The bandpass filter 48 generates an output analog RF signal that has been upconverted.

Figure 4B:
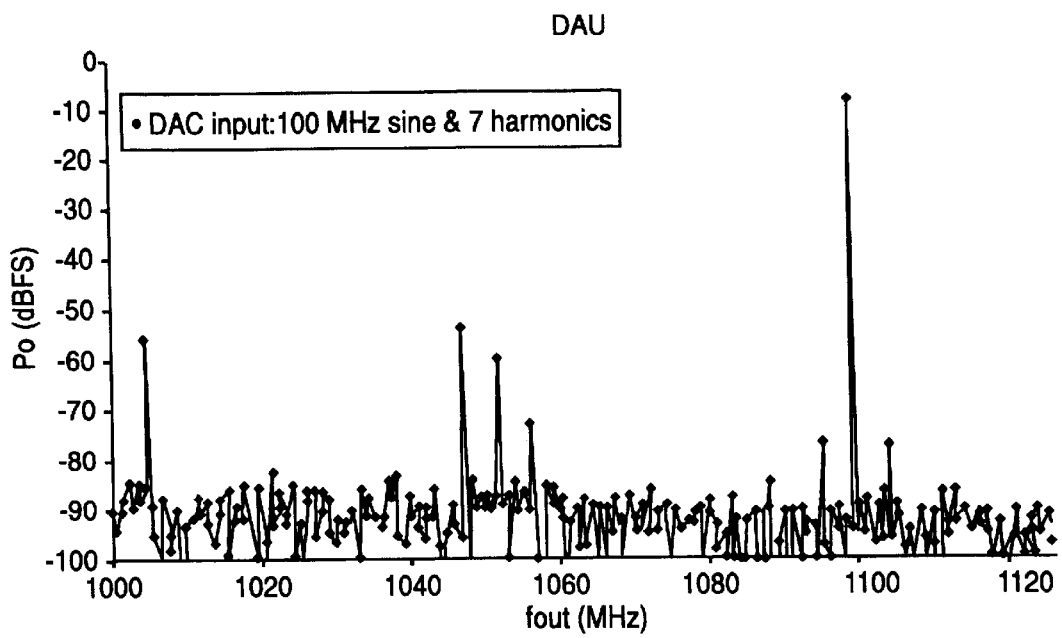
Figure 4C:
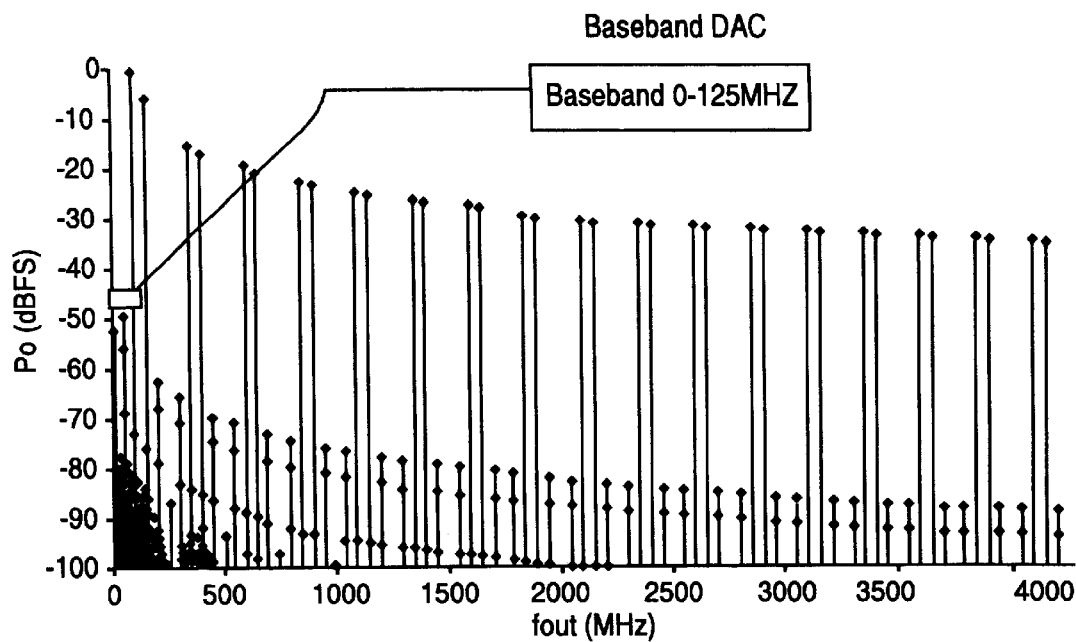
Figure 4D:
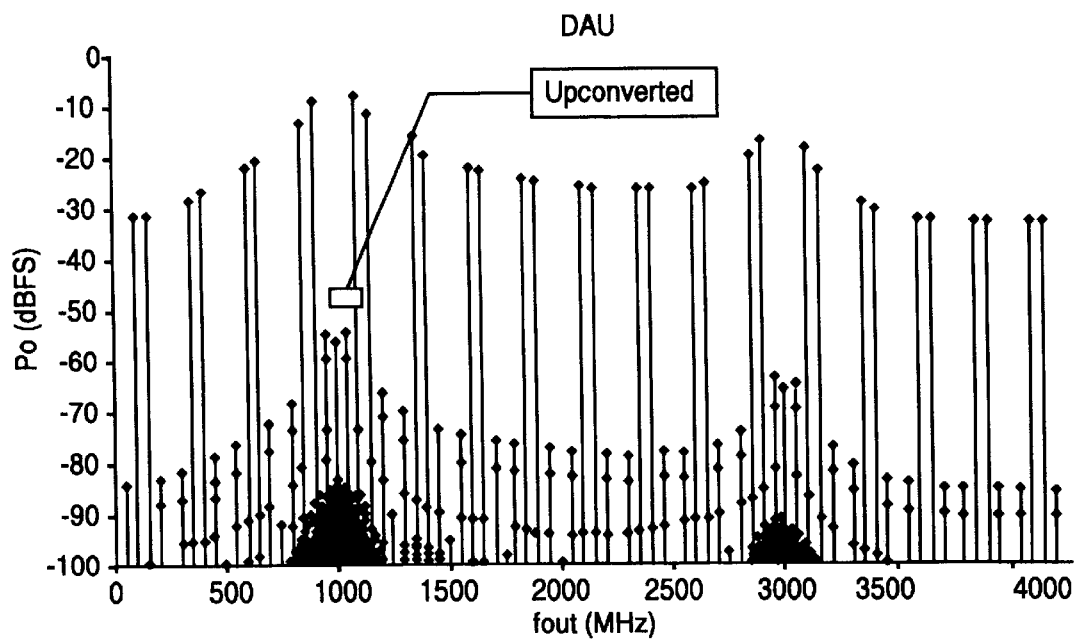

Referring now to FIGS. 4A–4D, the digital-to-analog upconverter 40 illustrated in FIG. 3 is efficient in several key aspects. FIGS. 4A & 4C are an example of a baseband DAC output in the frequency domain. FIGS. 4B & 4D are an example of the output of a digital-to-analog upconverter implemented in the present invention. It is important to note that in both cases, the baseband DAC and digital-to-analog upconverter, a sequence of data words input to both devices is identical. Upon comparison of FIGS. 4C and 4D, it is evident that the signal energy peaks at the desired output frequency in the digital-to-analog upconverter at a higher nyquist frequency band, in this example the $8^{th}$ and $9^{th}$ nyquist bands, as is generally desired from a power efficiency perspective. Secondly, in comparing the nyquist bands of FIGS. 4A and 4B, it is noted that the harmonic frequency spacing of the digital-to-analog upconverter of this invention mirrors that of the baseband DAC. Not only is the harmonic frequency spacing preserved but also the relative harmonic energy content is similar to the baseband DAC.

There is only one clock input to the digital-to-analog converter shown as 44 in FIG. 3. The sampling clock for the digital-to-analog converter is derived on the chip by dividing the mixer clock. The desired output signal band is either the upper or lower side band of the mixer LO signal, or mixer clock, that is provided as an input to the digital-to-analog upconverter. Thus, several key attributes of the digital-to-analog upconverter are the low input clock rates, the peak power at the desired upconverted output frequency band, only one clock signal is required, and the removal of the upconverting analog mixers and filters such as those shown in prior art FIG. 1. In FIG. 12, by using the mixer frequency as a phase coherent harmonic of the digital-to-analog converter sampling rate, the upconverted nyquist band is similar to the first nyquist band of the baseband digital-to-analog converter. As can be seen from overlaying FIGS. 4A and 4B, the upconverted frequencies align directly with the baseband DAC spectrum. In fact the upconverted harmonics of the digital-to-analog upconverter fall on top of their respective aliased copies. Not only is harmonic frequency spacing preserved but the relative signal levels are nearly the same in the upconverted nyquist band of an ideal digital-to-analog upconverter when compared to the first nyquist band of a baseband digital-to-analog converter. This is represented by FIGS. 4A and 4B. This is all achieved without a lowpass filter following the DAC prior to upconversion. Typically a lowpass filter is inserted between a baseband DAC and an upconverting mixer to minimize the signal level of undesired spurs created by mixer intermodulation products. Generally speaking, with the digital-to-analog upconverter shown here, no additional spurs are created in the upconverted nyquist band relative to the baseband, or first nyquist band, negating the need or usefulness of a lowpass filter.

Figure 5B:
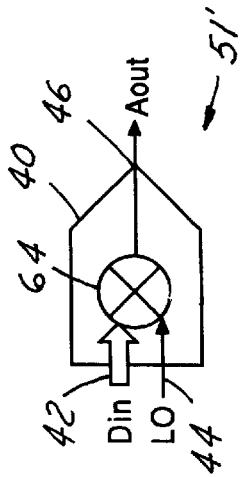
FIG. 5B is a functional block diagram of an embedded mixer and switching circuit.
Figure 5A:
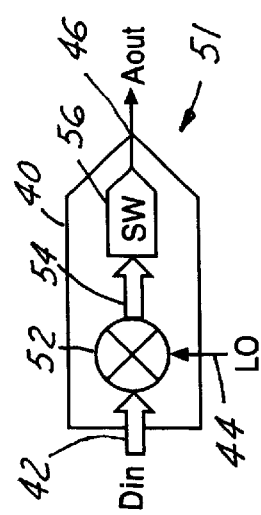
FIG. 5A is a functional block diagram of a digital-to-analog converter having a digital mix drive the analog current switches.

Referring now to FIG. 5A, a simplified version of a switching and mixing circuit 51 of the digital-to-analog upconverter 40 is illustrated. Digital input 42, clock signal input 44, and analog output 46 are carried over from FIG. 3. A digital mixer 52 receives the clock signal and the digital input signal which forms a mixed output signal 54 which is provided to switches 56 which in turn generate the analog output. The analog output may be current or voltage.

Referring now to FIG. 5B, an embedded mixer switch 64 as the switching and mixing circuit 51' is provided. Mixer switch 64 receives the digital input 42, the clock signal 44, and generates the analog output 46. FIG. 12 is an example of a more detailed description of mixer switch 64.

The embodiments of FIGS. 5A and 5B will be further described below.

Figure 6:
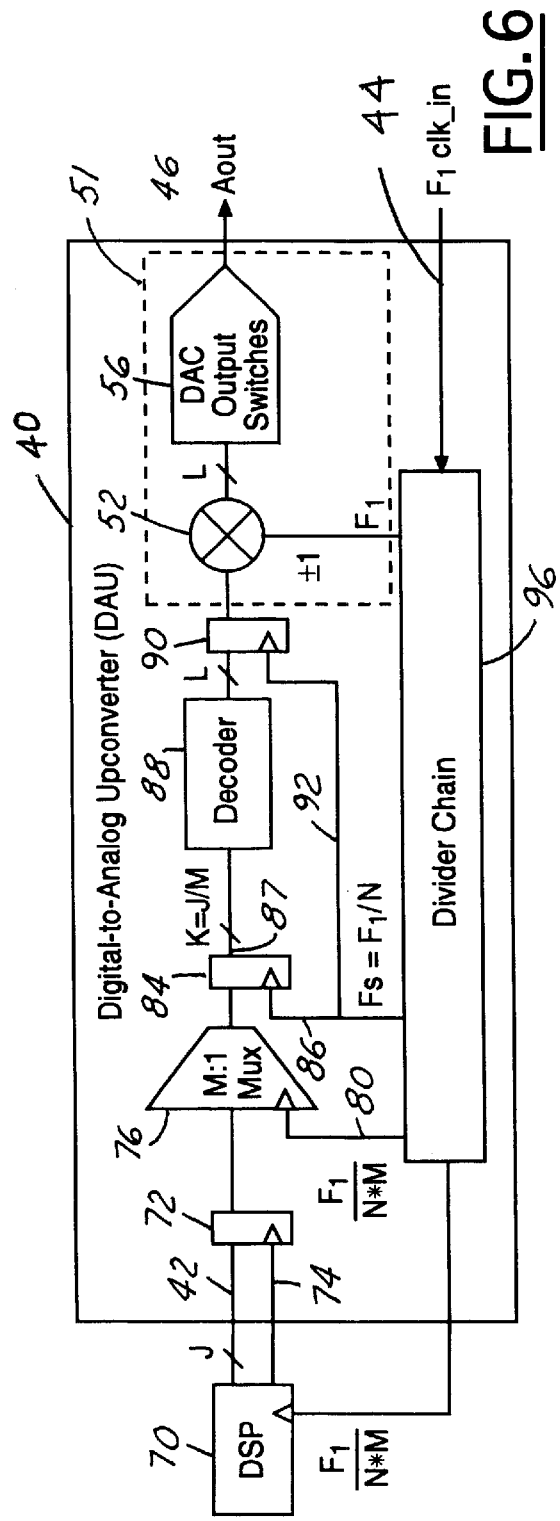
FIG. 6 is a conceptual block diagram of a more detailed block diagram according to the present invention.

Referring now to FIG. 6, the digital-to-analog upconverter 40 is shown in further detail. The digital-to-analog upconverter 40 is coupled to a digital input generating a digital signal such as digital signal processing circuitry 70. The digital signal from processing circuitry 70 is coupled to upconverter 40 through digital signal input 42. Input 42 has J bits that are provided to a register 72. The register 72 has a clock input 74 that is used to clock the digital register signals to multiplexer 76. Multiplexer 76 also has a clock input 80. Multiplexer 76 has an output 82 that is coupled to a second register 84. Register 84 also has a clock input 86. Register 84 has a K bit output 87 that is decoded in a decoder 88 to L bits. The decoder 88 converts the K bit input to L bit digital code at output 89 which is coupled to a register 90. Register 90 also includes a clock input 92. Decoder 88 may be a binary-to-thermometer decoder or other type of decoder depending on the arrangement of output switches.

As mentioned above, one clock input 44 is provided to upconverter 40. The clock input chain may be divided to operate multiplexer 76 and registers 72, 84, and 90. The clock input to registers 84 and 90 may be divided in divider chain 96 by an integer N while the clock input 80 to multiplexer 76 may be divided by N times M where M is the number of bits of the digital signal.

Register 90 is coupled to switching and mixing circuit 51. Switching and mixing circuit 51 includes digital mixer 52 and summing analog output switches 56. Switches 56 may be current switches or switched capacitor circuits which in effect act as voltage switches.

The present embodiment is similar to that shown in FIG. 5A above in that digital mixer 52 mixes the digital output with the clock input. The mixed output 54 is coupled to switch 56, which generates a corresponding current corresponding to the output of the digital mixer 52. The present invention provides the upconversion using the digital mixer 52, which is inserted between the decoder 88 and the digital-to-analog converter output switches 56.

Figure 7:
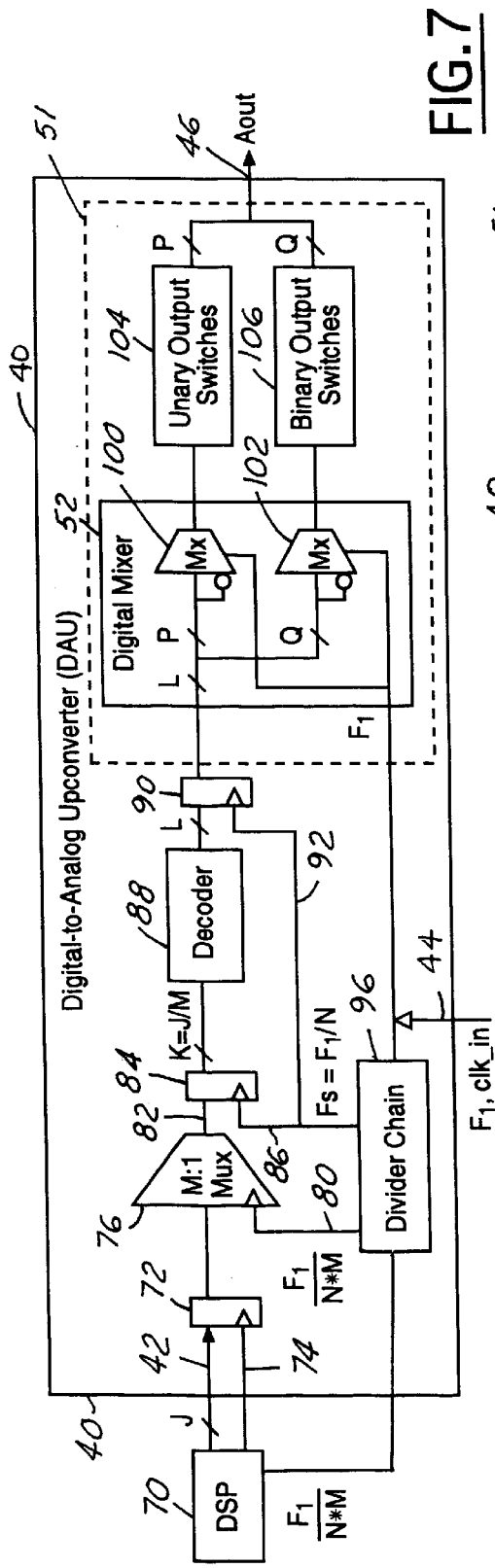
FIG. 7 is a more detailed functional block diagram of a digital-to-analog upconverter according to the present invention.

Referring now to FIG. 7, a more detailed description of the switching and mixing circuit 51 is illustrated. Switching circuit 51 receives the digital output from the register 90. This embodiment is similar to that shown in FIG. 5A. In this embodiment, a first multiplexer 100 and a second multiplexer 102 receive the digital signal from the register 90. As shown in this embodiment, multiplexer 100 receives P signals and the multiplexer 102 receives Q signals for a total of L. It should be noted that multiplexers 100 and 102 act as digital single bit mixers due to the inputs to each being both the input and an inverted input. Both unary output switches 104 and binary output switches 106 are used to generate the proper analog output signal. Thus, in this case the digital mixer 52 is positioned between the unary output switches 104 and the binary output switches 106 and the decoder 88. The output signals of the output switches add together to form the analog signal at the output 46 which may be current or voltage.

Figure 8:
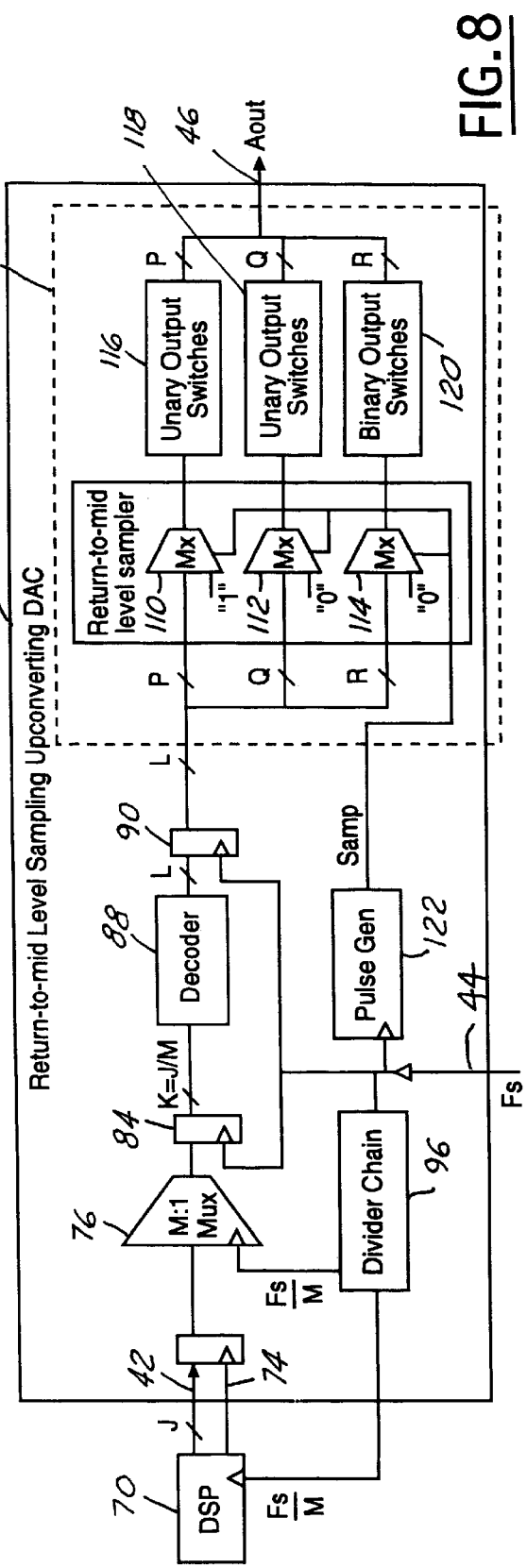
FIG. 8 is another embodiment of a digital-to-analog upconverter according to the present invention.

Referring now to FIG. 8, the same reference numerals are used to illustrate the same components. In this example the switching and mixing circuit 51 has been slightly altered to include three multiplexers 110, 112, and 114. Each multiplexer has a respective input 110A, 112A, 114A that is coupled to the output bus of the register 90. In this example P signals are coupled to multiplexer input 110A, Q signals are coupled to multiplexer input 112A, and R signals are coupled to multiplexer input 114A. Second respective inputs 110B, 112C, and 114C are coupled to respective bit signals "1", "0" and "0." Each multiplexer 110–114 is coupled to a set of output switches. Multiplexer 110 is coupled to unary output switches 116. Multiplexer 112 is coupled to unary switches 118. Multiplexer 114 is coupled to binary output switches 120. Unary output switches 116 have Q outputs. Unary switches 118 have P outputs and binary output switches 120 have R outputs. The combination of the signals from unary output switches 116, unary output switches 118, and binary output switches 120 form the analog output 46 corresponding to the digital signal at input 89.

In this circuit, a pulse generator 122 receives the clock signal which in turn generates a sample signal which is also coupled to the multiplexers 110, 112, and 114. It is the sample signal that controls the flow of the signals from the input to the output.

Figure 9:
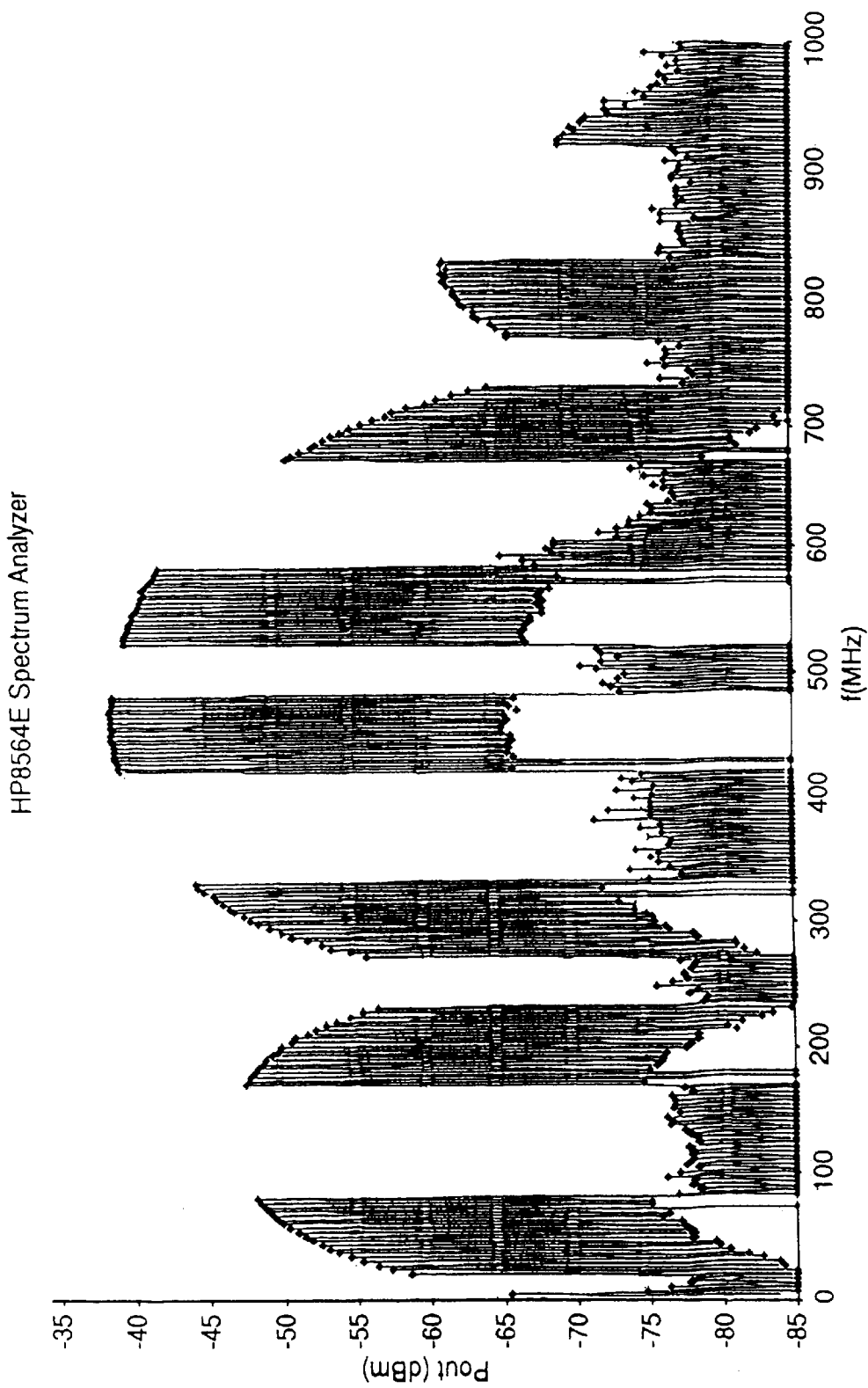
FIG. 9 is a plot of signal energy versus frequency for a digital-to-analog upconverter according to the present invention.

Referring now to FIG. 9, a plot of the digital-to-analog converter noise loaded output with a 4 MHz notch at 72 MHz and a sampling frequency 86 of 250 MHz is illustrated. With the sampling frequency of 250 MHz, the clock speed 44 is 500 MHz around which the signal is digitally upconverted.

Figure 10:
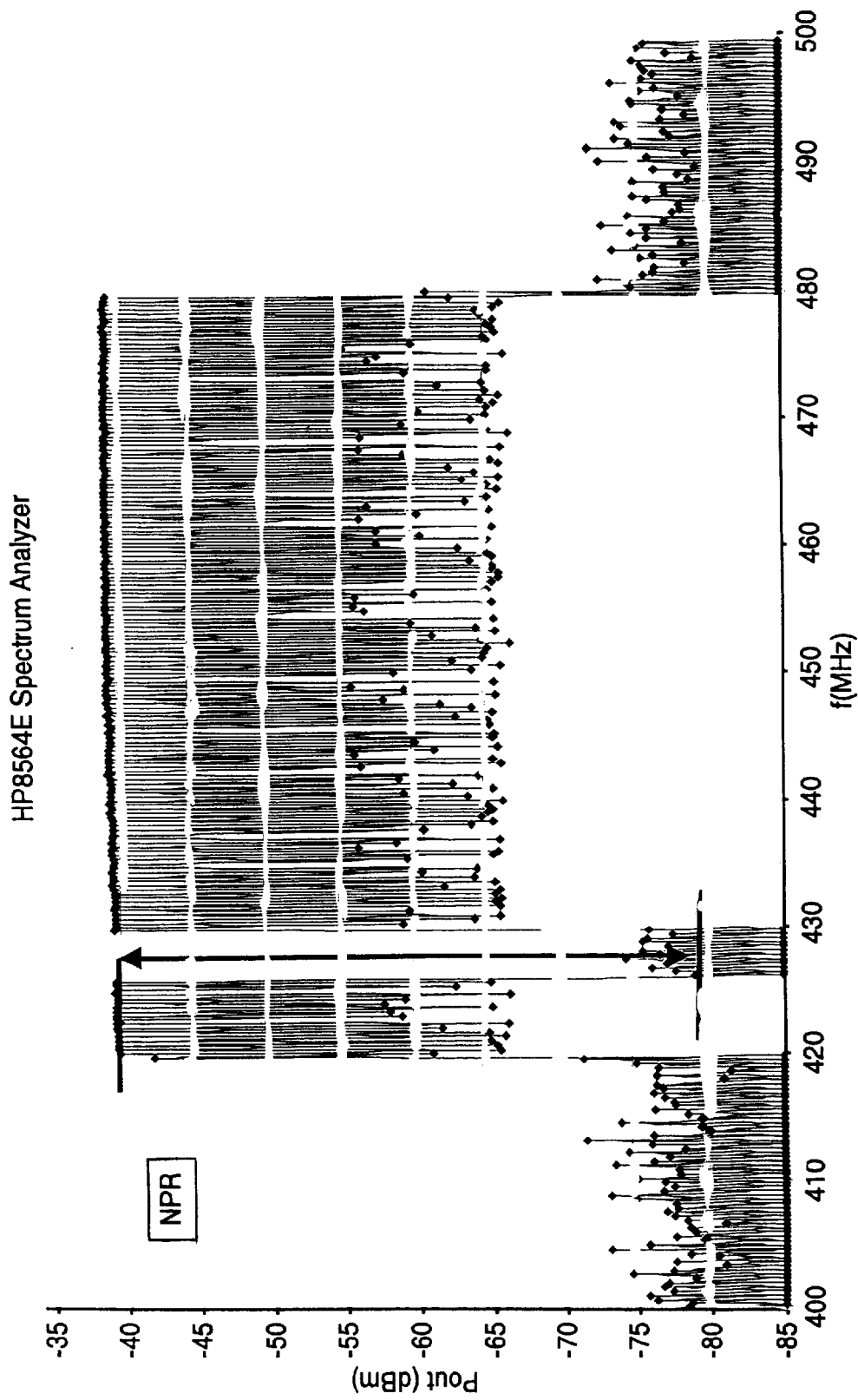
FIG. 10 is a plot of signal energy in the 400 to 500 MHz range of FIG. 9 enlarged to show the signal energy variation therein.

Referring now to FIG. 10, the portion of the spectrum between 400 and 500 MHz of FIG. 9 is illustrated. As can be seen, the upconverted spectrum is relatively flat. Here a noise loaded input signal is upconverted. A notch is placed in the noise band to perform a noise power ratio measurement, essentially a measure of the depth of the notch. The noise power ratio is in some respects a measure of channel-to-channel interference due to the digital-to-analog conversion process. The noise power ratio of digital-to-analog-upconverter is shown to be very similar to that of the same DAC operating in a baseband mode.

Referring now to FIG. 11, an alternative embodiment to those shown above is illustrated. This concept may be referred to as a multimode approach. The modes of operation of the digital-to-analog upconverter in this case may be defined as either normal, pulsed upconversion, mixed upconversion, or pulsed/mixed upconversion. Disabling or enabling the mixer clock frequency and/or the pulse generator respectively achieves operation in one of these four modes. Decoder 88 and the previous circuit may be the same as illustrated in FIGS. 6–8. The digital output of decoder 88 is provided to a register 150. The output of register 150 has a number of bits which are transferred to multiplexers (mixers) 152, 154, and 156. Each multiplexer in this case receives Q, P, and R bits, respectively. Each multiplexer 152, 154, and 156 is coupled to a second multiplexer 158, 160, and 162. The second outputs to multiplexers 158, 160 and 162 are coupled to a digital "1", "0" and "0", respectively. Each of the outputs of the second multiplexers 158, 160, and 162 are coupled to a respective plurality of output switches 170, 172, and 174. Each of the plurality of output switches has P, Q, and R outputs, respectively. That is, output switches 170 have a P bit output, output switches 172 have a Q bit output, and output switches 174 have an R bit output. The outputs of output switches 170, 172 and 174 are summed to generate the analog output 46. Of course, as mentioned above, voltage switches may be used. In the normal mode the mixer clock input which is the output of a multiplexer 121 and output signals of pulse generator 122 are disabled and held at static high. In the normal mode the digital-to-analog upconverter operates like a baseband DAC with multiplexers 152, 154, 156, 158, 160, and 162 held at a static high so digital words flow from decoder output 89 to current switches 170, 172, 174 unmodulated. In the pulse mode (pulse enable), the digital-to-analog upconverter will operate in a similar manner to that shown in FIG. 8, generating a return-to-zero or return-to-mid or return-to-an arbitrary offset level pulses depending on the design implementation. In the mixed-up-conversion mode (mix enable), the digital data is digitally mixed with the upconversion clock, which then drives a set of current or voltage switches, which combine to provide the upconversion analog output.

The fourth mode, mixed-pulsed-up-conversion mode is achieved by enabling both the mixer clock and the pulse generator.

Each of multiplexers 158, 160 and 162 are coupled to pulse generator 122 and are operated partially in response thereto. Multiplexers 152, 154, 156, 158, 160, and 162 are coupled to mixer enable circuit in a similar manner to that described above.

Referring now to FIG. 12, mixing and switching circuit 51" is illustrated according to another embodiment of the invention. In this embodiment, two pairs of emitter coupled transistors are provided. The first pair 230 has a first transistor 232 and a second transistor 234 while the second pair of transistors 236 has a first transistor 238 and a second transistor 240. Each transistor has a base b, a collector c, and an emitter e. In this embodiment an analog out signal Aout and an inverted analog output signal Aoutn is generated. The collector of transistor 232 is coupled to the analog Aout signal as well as the collector of transistor 240. The collector of transistors 234 and 238 are coupled to the inverted analog out signal. The emitters of transistors 232 and 234 are coupled together. The emitters of transistors 238 and 240 are coupled together. The base of transistors 232 and 240 are coupled to the clock signal. The base of transistors 234 and 238 are coupled to the inverted clock signal (LOn). The emitters of transistors 232 and 234 are coupled to the collector of transistor 242. The base of transistor 242 is coupled to a signal Di. The emitters of transistors 238 and 240 are coupled to the collector of transistor 244. The base of transistor 244 is coupled to the inverted signal Din. The emitters of transistors 242 and 244 are coupled together which in turn are coupled to the collector c of transistor 246. The base of transistor 246 is coupled to a signal $V_b$. The emitter e of transistor 246 is coupled to voltage reference Vee through a resistor $R_f$. It should be noted that the embodiment illustrated in FIG. 11 is a more detailed version of that shown on FIG. 5B. Thus, the digital input and inverted digital input provided to the transistors in combination with the clock signal provides an analog output corresponding to an upconverted signal.

FIG. 12 is representative of a standard gilbert cell mixer function. It is equally valid to swap the LO/LOn pins with the Di and Din pins. In addition, it is equally valid to implement this function using FET devices instead of the bipolar devices shown. In such a case source coupled FETs would be used where there are emitter-coupled transistors.

In operation the digital signal is provided to the digital-to-analog upconverter 40 such as through digital signal processing circuitry 70. A sample rate signal and a divided sample rate signal are provided by divider chain 96 using the clock input 44. The divided sample rate signal is used to drive the decode circuit 88. The digital outputs of the decoder 88 is combined with the sample rate signal in a mixer 52 which in turn directs a plurality of output switches to the output 46.

While the invention has been described in connection with one or more embodiments, it should be understood that the invention is not limited to those embodiments. On the contrary, the invention is intended to cover all alternatives, modifications, and equivalents, as may be included within the spirit and scope of the appended claims.

What is claimed is:

1. A digital-to-analog upconverter comprising:
   a digital input;
   a clock circuit generating a sample rate signal;
   a decoder circuit generating a decoded digital signal;
   a switching and digital mixing circuit coupled to said decoder circuit, said switching and mixing circuit comprising a mixer coupled to a plurality of output switches, said mixer circuit coupled to said clock circuit, said mixing circuit mixing said sample rate signal and said decoded digital signal, said switching and mixing circuit digitally upconverting said decoded signal, said switching circuit generating an analog output signal.

2. A digital-to-analog upconverter as recited in claim 1 wherein said plurality of switches comprises voltage switches.

3. A digital-to-analog upconverter as recited in claim 1 wherein said plurality of output switches comprises an array of unary, binary, or other weighted current switches.

4. A digital-to-analog upconverter as recited in claim 1 wherein said clock circuit comprises a clock sample rate divider for dividing said sample rate signal by an integer to form a divided sample rate signal, said mixer coupled to the sample rate signal and said decode digital signal coupled to said divided sample rate signal.

5. A digital-to-analog upconverter as recited in claim 1 wherein said switching and mixing circuit comprises a first pair of emitter coupled transistors or source coupled FETs and a second pair of emitter coupled transistors or source coupled FETs, each of said first pair and said second pair of transistor or FETs operating in response to said sample rate signal and an inverted sample rate signal.

6. A digital-to-analog upconverter as recited in claim 1 wherein said mixer comprises a plurality of multiplexers coupled to said sample rate signal.

7. A digital-to-analog upconverter as recited in claim 1 wherein said plurality of multiplexers comprise a second plurality of multiplexers having a pulse input, said pulse input coupled to a pulse generator, said pulse generator operating in response to said sample rate signal.

8. A communications system comprising:
   a digital signal source generating a digital signal; and
   a digital-to-analog upconverter comprising
      a digital input;
      a clock circuit generating a sample rate signal and a divided sample rate signal;
      a decoder circuit coupled to said clock circuit generating a decoded digital signal in response to the digital signal and said divided sample rate signal;
      a switching and mixing circuit coupled to said decoder circuit, said switching and mixing circuit comprising a mixer coupled to a plurality of output switches, said mixer circuit coupled to said clock circuit, said mixing circuit mixing said sample rate signal and said decoded digital signal, said switching and mixing circuit upconverting said decoded digital signal, said switching circuit generating an analog output signal.

9. A communications system as recited in claim 8 wherein said plurality of output switches comprises voltage switches.

10. A communications system as recited in claim 8 further comprising a band pass filter coupled to said analog output.

11. A communications system as recited in claim 8 wherein said decoder comprises a binary-to-thermometer decoder.

12. A communications system as recited in claim 8 wherein said plurality of output switches comprises an array of unary, binary, or other weighted current switches.

13. A communications system as recited in claim 8 wherein said clock circuit comprises a clock sample rate divider for dividing said sample rate signal by an integer to form a divided sample rate signal, said mixer coupled to the sample rate signal and said digital-to-analog signal coupled to said divided sample rate signal.

14. A communications system as recited in claim 8 wherein said switching and mixing circuit comprises a first pair of emitter coupled transistors and a second pair of emitter coupled transistors, each of said first pair and said second pair of transistors operating in response to said sample rate signal and an inverted sample rate signal.

15. A communications system as recited in claim 8 wherein said mixer comprises a plurality of multiplexers coupled to said sample rate signal.

16. A communications system as recited in claim 8 wherein said plurality of multiplexers comprise a first plurality of multiplexers having a mix input for receiving a mix signal.

17. A communications system as recited in claim 8 wherein said plurality of multiplexers comprise a second plurality of multiplexers having a pulse input, said pulse input coupled to a pulse generator, said pulse generator operating in response to said sample rate signal.

18. A method for operating a digital-to-analog upconverter comprising:

generating a sample rate signal;

dividing the sample rate signal by an integer to form a divided sample rate signal;

converting a digital signal to decoded digital signal in response to the divided sample rate signal;

mixing the sample rate signal and the digital signal; and generating an analog output in response to the digital upconverted signal.

19. A method as recited in claim 18 wherein generating an analog output comprises generating an analog current signal.

20. A method as recited in claim 18 wherein generating an analog output comprises generating an analog voltage signal.

21. A method as recited in claim 18 further comprising generating a pulse signal, wherein upconversion is performed in response to said pulse signal.

22. A method as recited in claim 18 further comprising generating a mix signal, wherein mixing is performed in response to said mix signal.

23. A method as recited in claim 18 further comprising generating a division signal, wherein dividing is performed in response to the division signal.

* * * * *